(12) United States Patent
Lorin et al.

(10) Patent No.: US 9,459,321 B2
(45) Date of Patent: Oct. 4, 2016

(54) DEVICE FOR MEASURING THE NO-LOAD VOLTAGE OF A BATTERY

(71) Applicant: STMICROELECTRONICS (GRENOBLE 2) SAS, Grenoble (FR)

(72) Inventors: Christophe Lorin, Montbonnot (FR); Jean-François Garnier, Vif (FR); Aurélien Mazard, Saint Egreve (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 511 days.

(21) Appl. No.: 13/778,384

(22) Filed: Feb. 27, 2013

(65) Prior Publication Data

US 2013/0221927 A1 Aug. 29, 2013

(30) Foreign Application Priority Data

Feb. 29, 2012 (FR) .................................... 12 51865

(51) Int. Cl.
*H02J 7/00* (2006.01)
*G01R 31/36* (2006.01)

(52) U.S. Cl.
CPC ............ *G01R 31/36* (2013.01); *G01R 31/362* (2013.01); *H02J 7/007* (2013.01); *H02J 7/0047* (2013.01); *H02J 7/0077* (2013.01); *H02J 7/0088* (2013.01); *G01R 31/3637* (2013.01)

(58) Field of Classification Search
CPC ...... H02J 7/0047; H02J 7/007; H02J 7/0077; H02J 7/0088; G01R 31/36; G01R 31/362; G01R 31/3637
USPC .......................................... 320/132; 324/429
See application file for complete search history.

(56) References Cited

U.S. PATENT DOCUMENTS

| 6,445,162 | B1 * | 9/2002 | Mukainakano ............... 320/132 |
| 7,564,214 | B2 * | 7/2009 | Sasaki et al. ................. 320/106 |
| 2007/0024242 | A1 * | 2/2007 | Seo et al. ....................... 320/132 |
| 2007/0182380 | A1 * | 8/2007 | DiGiovanna et al. ........ 320/150 |
| 2008/0054908 | A1 | 3/2008 | Suzuki |
| 2008/0238362 | A1 * | 10/2008 | Pinnell ................... H02J 7/042 320/107 |
| 2010/0010707 | A1 | 1/2010 | Izumi et al. |

FOREIGN PATENT DOCUMENTS

EP 2246956 A1 11/2010

* cited by examiner

*Primary Examiner* — Nathaniel Pelton
(74) *Attorney, Agent, or Firm* — Allen, Dyer, Doppelt, Milbrath & Gilchrist, P.A.

(57) ABSTRACT

A method for measuring the voltage of a battery of an electronic device by means of a measurement device integrated to the electronic device, wherein, after the connection of the battery to the electronic device, the measurement device prevents battery charge and discharge operations during the measurement.

5 Claims, 4 Drawing Sheets

DEVICE FOR MEASURING THE NO-LOAD VOLTAGE OF A BATTERY

CROSS REFERENCE TO RELATED APPLICATION

This application is a translation of and claims the priority benefit of French patent application number 12/51865 filed on Feb. 29, 2012, entitled "DEVICE FOR MEASURING THE NO-LOAD VOLTAGE OF A BATTERY" which is hereby incorporated by reference to the maximum extent allowable by law.

BACKGROUND

1. Technical Field

The present disclosure relates to a device and a method for measuring the no-load voltage of a battery.

2. Discussion of the Art

Some electronic devices are powered by a battery. This is for example true for cell phones, laptop computers, tablet computers, video cameras, photo cameras, etc. For the proper operation of the electronic device, it is desirable to accurately determine the battery charge rate. The battery charge rate can be determined from the measurement of the no load voltage across the battery. The no-load voltage is the voltage across the battery substantially in the absence of electronic components connected to the battery, except for the measurement device, causing the battery charge or discharge.

However, when the battery powers the electronic components of the electronic device or when it is being charged by a power source connected to the electronic device, the voltage across the battery is generally different from the no-load voltage. In this case, the measured voltage must be corrected, which causes an inaccuracy of the charge rate thus determined.

Generally, the electronic device comprises a device for measuring the voltage across the battery just after the connection of the battery to the electronic device. Indeed, at this time, all the electronic components of the electronic device are generally turned off and no power source is connected to the electronic device, so that the measured voltage is equal to the no-load voltage of the battery. The measurement device converts the analog signal into digital data which are stored in a memory. The measurement operation may last for several hundreds of milliseconds. After the full start of the electronic device, the electronic device processing unit, for example, a microcontroller which controls the main functions of the electronic device, can read the value stored in the memory of the measurement device to determine the battery charge rate.

The measurement device converts the analog signal into digital data which are stored in a memory. The finally-measured voltage may then be different from the no-load voltage.

To decrease risks of battery use before the end of the measurement, a possibility is to decrease the duration of the battery voltage measurement operation after the connection of the battery to the electronic device. This duration can be decreased by decreasing the accuracy of the digital data obtained at the analog-to-digital conversion step. However, this is not compatible with the current tendency, which is to increase the accuracy of the battery charge rate determination.

There thus is a need to decrease risks for the battery voltage measurement on connection of a battery to an electronic device not to correspond to the no-load voltage of the battery, without decreasing the measurement accuracy.

BRIEF SUMMARY

An embodiment overcomes all or part of the previously-described disadvantages.

Another embodiment provides for the battery voltage measured on connection of the battery to the electronic device to correspond to the no-load voltage of the battery.

Another embodiment does to decrease the measurement accuracy of the battery voltage measurement after the connection of a battery to the electronic device with respect to the accuracy obtained in subsequent measurements.

Another embodiment does not modify the structure of the other electronic components of the electronic device.

Thus, an embodiment provides a method for measuring the voltage of a battery of an electronic device by means of a measurement device integrated to the electronic device, wherein, after the connection of the battery to the electronic device, the measurement device prevents battery charge and discharge operations during the measurement.

According to an embodiment, the electronic device further comprises a processing unit powered in operation by the battery, the method comprising preventing the starting of the processing unit during the measurement.

According to an embodiment, the electronic device further comprises a power supply unit providing a power supply voltage to the processing unit from the battery voltage, and providing the processing unit with a first signal at a first level to allow the starting of the processing unit and at a second level to prevent the starting of the processing unit, the measurement device setting the first signal to the second level during the measurement.

According to an embodiment, the electronic device comprises a charge unit capable of being connected to a power source and capable of recharging the battery when it is connected to the power source, the method comprising preventing a battery charge operation by the charge unit during the measurement.

According to an embodiment, the charge unit is capable of measuring a second signal at a terminal of the battery and of not charging the battery when the second signal is greater than a threshold, the method comprising maintaining the second signal above the threshold during the measurement.

According to an embodiment, on connection of the battery to the electronic device, the measurement device prevents battery charge and discharge operations during several successive measurements.

An embodiment also provides an electronic device comprising a battery and a device for measuring the battery voltage, wherein the measurement device is capable, after the connection of the battery to the electronic device, of preventing battery charge and discharge operations during the measurement.

According to an embodiment, the device further comprises a processing unit powered in operation by the battery, the measurement device being capable, after the connection of the battery to the electronic device, of preventing the starting of the processing unit during the measurement.

According to an embodiment, the device further comprises a power supply unit capable of providing a power supply voltage to the processing unit from the battery voltage, and of providing the processing unit with a first signal at a first level to allow the starting of the processing unit and at a second level to prevent the starting of the processing unit, the measurement device being capable of setting the first signal to the second level during the measurement.

According to an embodiment, the device comprises a charge unit capable of being connected to a power source and capable of recharging the battery when it is connected to the power source, the measurement device being capable, after the connection of the battery to the electronic device, of preventing an operation of battery charge by the charge unit during the measurement.

According to an embodiment, the battery comprises a terminal connected to the charge unit, the charge unit being capable of measuring a second signal on the terminal and of not charging the battery when the second signal is greater than a threshold, the measurement device being capable of maintaining the second signal above the threshold during the measurement.

The foregoing and other features and benefits will be discussed in detail in the following non-limiting description of specific embodiments in connection with the accompanying drawings.

DETAILED DESCRIPTION

Figure 1:
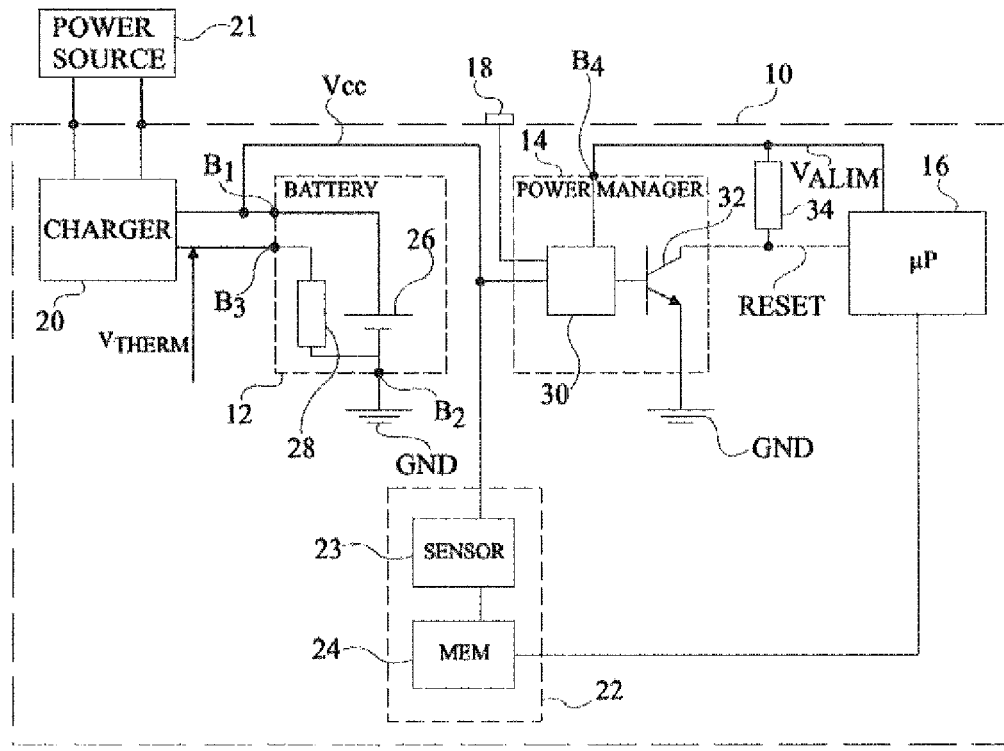
FIG. 1 partially and schematically shows an example of a known electronic device powered by a battery.

For clarity, the same elements have been designated with the same reference numerals in the different drawings. Further, only those elements which are useful to the understanding of the present invention have been shown and are described. Further, in the following description, a binary signal corresponds to a signal at a low level, also called '0', or at a high level, also called '1'. It should however be clear that the high levels of the binary signals may be different from one binary signal to the other and that the low levels of the binary signals may be different from one binary signal to the other.

FIG. 1 partially and schematically shows an example of an electronic device 10. Only the electronic components of the device which are useful to the understanding of the present invention have been shown and will be described. Device 10 comprises a battery 12 (BATTERY), which, when it is connected to electronic device 10, provides a voltage VCC.

Device 10 comprises a power supply unit 14 (POWER MANAGER) which generates, from voltage VCC, the power supply voltages of the internal components of device 10. Power supply unit 14 may further provide the clock signals used to rate the operation of the components of device 10.

Device 10 comprises a processing unit 16 (μP), for example, a microcontroller, which performs the main functions of device 10. Power supply unit 14 provides power supply voltage $V_{ALIM}$ to processing unit 16. Power supply unit 14 further provides a binary signal RESET to processing unit 16. Signal RESET for example is at a high level when the conditions for processing unit 16 to operate properly are fulfilled, for example, when power supply voltage $V_{ALIM}$ is sufficiently high. Signal RESET for example is at a low level when the conditions for processing unit 16 to operate properly are not fulfilled.

Device 10 may comprise an on/off switch 18 connected to power supply unit 14. A user of device 10 can turn electronic device 10 on or off by operating switch 18.

Device 10 comprises a charge unit 20 (CHARGER) connected to battery 12. Charge unit 20 may be connected to a power source 21 (POWER SOURCE), external to device 10, and can then control the charge of battery 12 from the power provided by power source 21.

Device 10 further comprises a unit 22 for measuring voltage VCC provided by battery 12. In known fashion, measurement device 22 comprises a sensor 23 (SENSOR) capable of measuring voltage VCC while being powered by battery 12 independently from the fact that processing unit 16 has started or not. As an example, sensor 23 samples voltage VCC, converts the sampled analog voltage into digital data, and stores the digital data in a memory 24 (MEM). Processing unit 16 can read the stored digital value to determine the charge rate of battery 12.

In more detailed fashion, battery 12 may comprise three terminals $B_1$, $B_2$, and $B_3$ suds voltage source 26 between terminals $B_1$ and $B_2$. When battery 12 is connected to device 10, terminal $B_1$ provides voltages VCC and terminal $B_2$ is connected to a source of a low reference potential GND of device 10. Battery 12 further comprises a resistor 26 coupled between terminals $B_3$ and $B_2$. Resistor 28 is a thermistor having its value varying according to temperature. It is a known protection device for preventing the operation of battery 12 in charge or in discharge when the temperature of battery 12 is too high, which could deteriorate battery 12. Call $V_{THERM}$ the voltage across resistor 28. Charge unit 20 is connected to terminals $B_1$ and $B_3$ of battery 12. In known fashion, when power source 21 is connected to charge unit 20 of electronic device 10, charge unit 20 can bias terminal $B_3$ and measure voltage $V_{THERM}$ before starting the charge of battery 12. If voltage $V_{THERM}$ is greater than a threshold, charge unit 20 then does not perform the charge operation.

Power supply unit 14 comprises a control unit 30 receiving voltage VCC and providing, at a terminal $B_4$, power supply voltage $V_{ALIM}$ to processing unit 16. Power supply unit 14 further comprises a transistor 32, for example an NPN bipolar transistor, having its base connected to control unit 30, having its collector providing signal RESET, and having its emitter connected to the source of low reference potential GND. Further, the collector of transistor 32 is connected to terminal $B_4$ by a resistor 34. Transistor 32 operates in switched mode. Control unit 30 turns on transistor 32 to set signal RESET to the low level.

Figure 2:
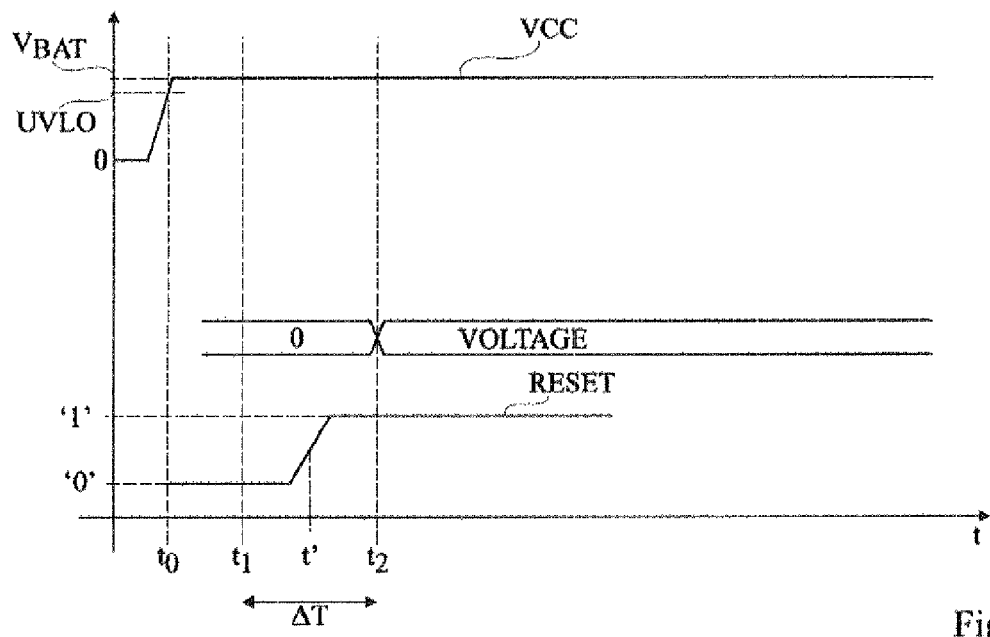
FIG. 2 is a timing diagram of electric signals of the electronic device of FIG. 1 on measurement of the no-load battery voltage.

FIG. 2 is a timing diagram of internal signals of electronic device 10 shown in FIG. 1 when battery 12 is connected to device 10. Call $t_0$, $t_1$, and $t_2$ successive times.

When battery 12 is connected to electronic device 10, voltage VCC increases by 0 V at the value of no-load voltage $V_{BAT}$. At time $t_0$, voltage VCC reaches the minimum operating voltage of electronic device 10 or UVLO (Undervoltage-Lockout) voltage. As long as power supply unit 14 is not capable of providing the power supply voltages and the clock signals necessary for the operation of device 10, it maintains signal RESET at the low level.

Time $t_1$ corresponds to the starting of a measurement of voltage VCC by measurement device 22. The delay between times $t_1$ and $t_0$ especially enables voltage VCC to settle at $V_{BAT}$. The measurement comprises the sampling of voltage VCC, the analog-to-digital conversion of the sampled value, and the storage in memory 24 of digital data VOLTAGE resulting from the analog-to-digital conversion.

At time $t_2$, the measurement of voltage VCC is finished. Delay $\Delta T$ between times $t_2$ and $t_1$ corresponds to the duration of a measurement of voltage VCC. Digital value VOLTAGE stored in memory 24 can be read. Measurement device 22 may further comprise a counter which is set to zero on connection of battery 12 and which is incremented by one for each measurement of voltage VCC. At time $t_2$, the counter is then incremented to 1.

Duration $\Delta T$ may be on the order of 200 ms. A disadvantage of this measurement method is that the power supply unit may set signal RESET to '1' during time period $\Delta T$ (time t' in FIG. 2). It is thus possible for processing unit 16 to start during time period $\Delta T$ and to use battery 12. Further, during time period $\Delta T$, power source 21 may be connected to device 10 and charge unit 20 may start the charge of battery 12. Data VOLTAGE may then not correspond to the no load voltage of battery 12.

Figure 3:
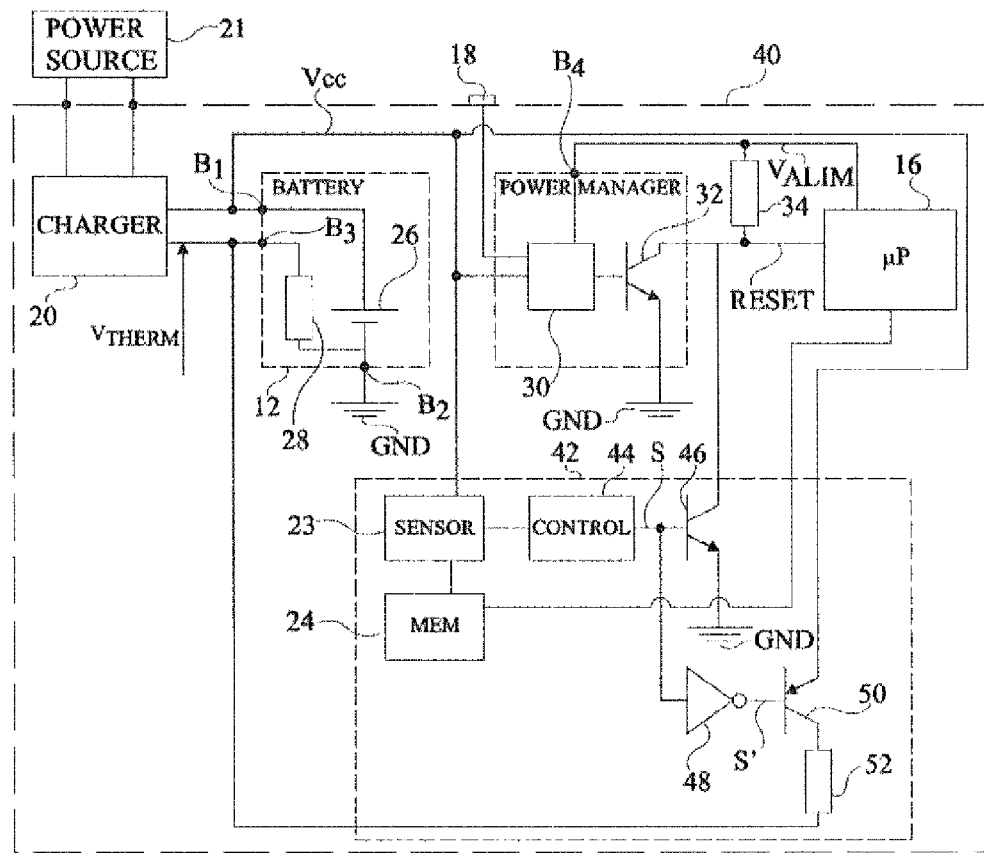
FIG. 3 partially and schematically shows an embodiment of an electronic device powered by a battery.

FIG. 3 shows an embodiment of an electronic device 40 which comprises the same components as electronic device 10 shown in FIG. 1 except for measurement device 42, which is modified.

Measurement device 42 of device 40 comprises sensor 23 and memory 24 of measurement device 22 shown in FIG. 1. Measurement device 42 further comprises a control unit 44 (CONTROL) which provides a binary signal S to the base of a bipolar transistor 46, for example, an NPN bipolar transistor. The collector of transistor 46 is coupled to the collector of transistor 32. The emitter of transistor 46 is coupled to the source of reference potential GND. Measurement device 42 comprises an inverter 48 receiving signal S. Inverter 48 delivers a signal S' to the base of a bipolar transistor 50, for example, a PNP bipolar transistor. The emitter of transistor 50 is coupled to terminal $B_1$ and the collector of transistor 50 is connected to terminal $B_3$ via a resistor 52. Transistors 46 and 50 operate in switched mode.

Figure 4:
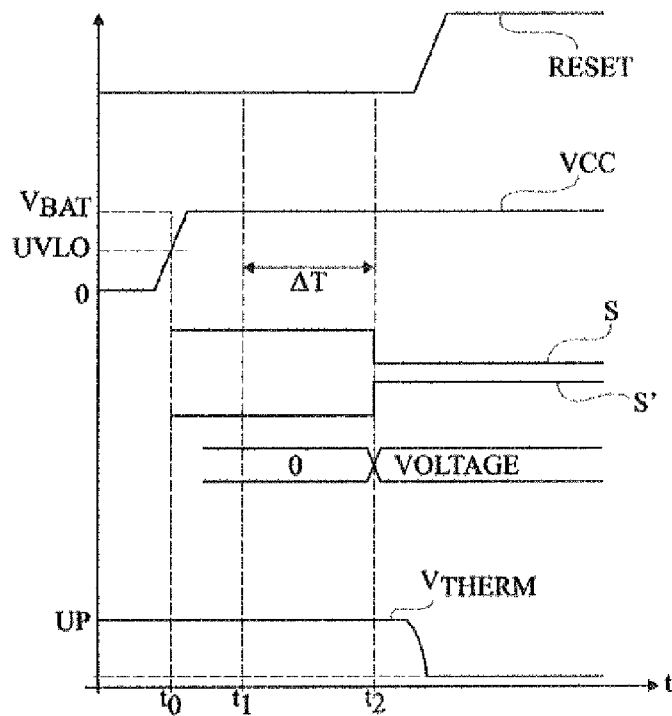
FIG. 4 is a timing diagram of electric signals of the electronic device of FIG. 3 on measurement of the no-load battery voltage.

FIG. 4 is a timing diagram of signals of device 40 during a measurement of the no-load voltage of battery 12 by measurement device 42.

When battery 12 is connected to electronic device 40, voltage VCC increases by 0 V at the value of no-load voltage $V_{BAT}$.

At time $t_0$, voltage VCC reaches voltage UVLO. Measurement device 42, powered by voltage VCC, sets signal S to the high state. Transistor 46 is then conductive and substantially equivalent to an on switch. The voltage between the collector and the emitter of transistor 42 is low, for example, on the order of 0.2 V. Signal RESET is than maintained at the low level.

Signal S' is at the low level. Transistor 50 is then conductive and substantially equivalent to an on switch. Voltage $V_{THERM}$ on terminal $B_3$ is then set by the voltage dividing bridge formed by resistors 28 and 52 to a value UP. Resistor 52 is selected so that value UP of voltage $V_{THERM}$ is greater than the voltage threshold below which charge unit 20 can start a charge of battery 12.

Between times $t_1$ and $t_2$, voltage VCC is measured. Between $t_1$ and $t_2$, signal S is maintained at the high level. Signal RESET is thus maintained in the low level even if control unit 30 of power supply unit 14 turns on transistor 32. Processing unit 16 thus cannot start. The measurement of voltage VCC thus cannot be disturbed by the starting of processing unit 16. Between times $t_1$ and $t_2$, signal S' is maintained at the low level. Voltage $V_{THERM}$ is thus maintained at high level UP. The charge of battery 12 by charge unit 20 thus cannot start. The measurement of voltage VCC thus cannot be disturbed by a charge of battery 12 by charge unit 20.

At time $t_2$, the measurement of voltage VCC is finished. Digital data VOLTAGE stored in memory 24 can be read. Control unit 44 sets signal S to the low level. Transistor 46 is then non-conductive and substantially equivalent to an off switch. The level of signal RESET is then set by the on or off state of transistor 32, that is, by power supply unit 14. At time $t_2$, signal S' is set to the low level. Transistor 50 is then non-conductive and substantially equivalent to an off switch. The level of signal $V_{THERM}$ can then vary in the case where power source 21 is connected to device 40 and a charge cycle of battery 12 can start.

Advantageously, since the measured voltage VCC corresponds for certain to the no-load voltage of battery 12 with no risk of disturbance, the measurement can be performed with the desired accuracy. Further, measurement device 42 uses signal RESET and voltage $V_{THERM}$, generally already present in an electronic device comprising a battery, to prevent operations of charge and discharge of battery 12 during the read operation. Thereby, the present embodiment causes no modification of the electronic components of the device other than the measurement device.

Figure 5:
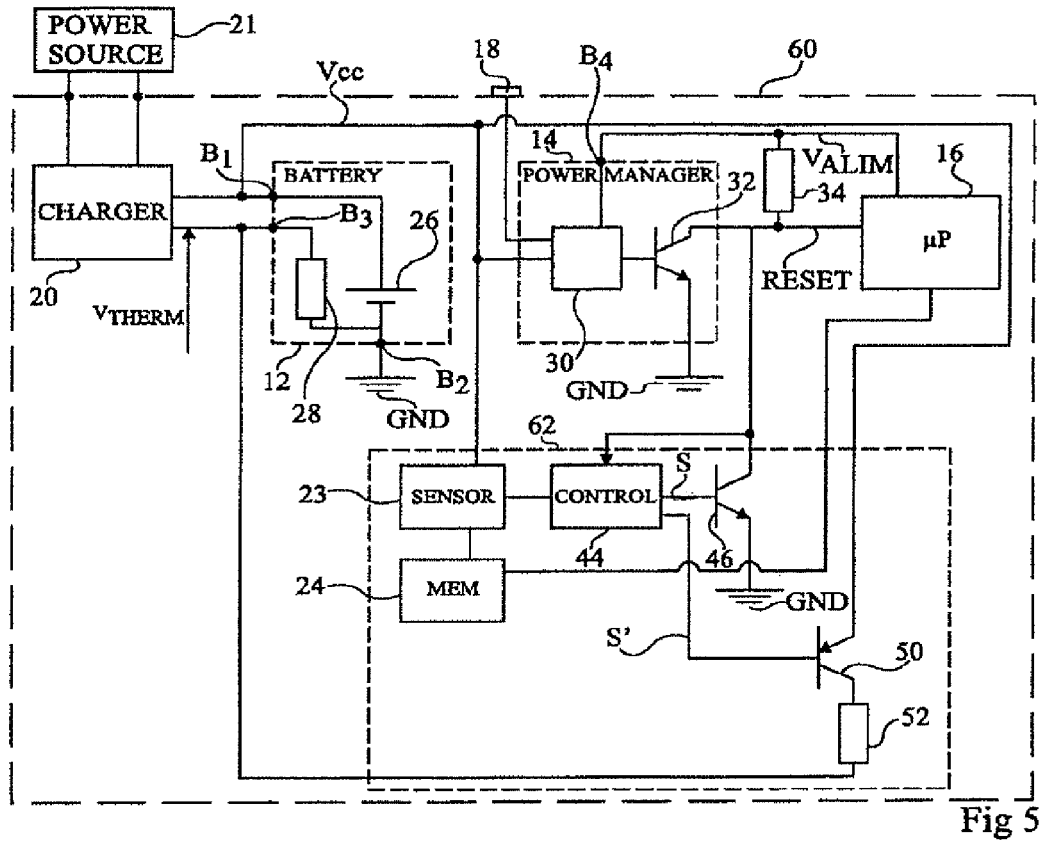
FIG. 5 partially and schematically shows another embodiment of an electronic device powered by a battery.

FIG. 5 shows another embodiment of an electronic device 60 which comprises the same components as electronic device 40 shown in FIG. 3, except for measurement device 62, which is modified. Signals S and S' are delivered independently from each other by control unit 44 of measurement device 62. Control unit 44 further receives signal RESET and is capable of detecting whether signal RESET is at the high level or at the low level.

Figure 7:
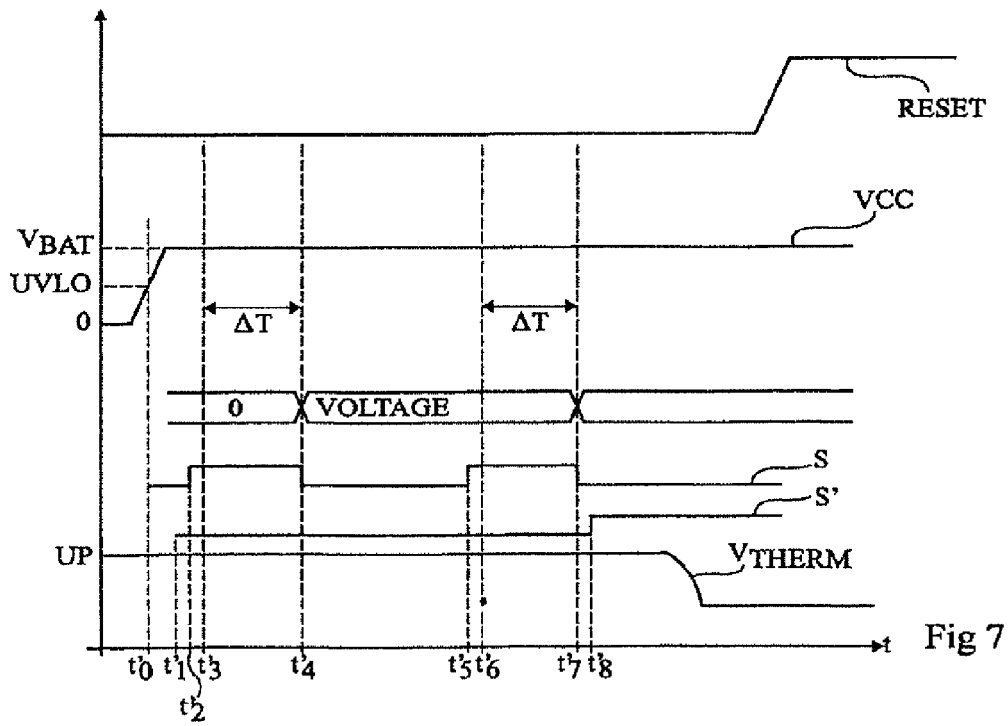
FIG. 7 is an example of a timing diagram of electric signals of the electronic device of FIG. 5 on measurement of the no-load battery voltage.
Figure 6:
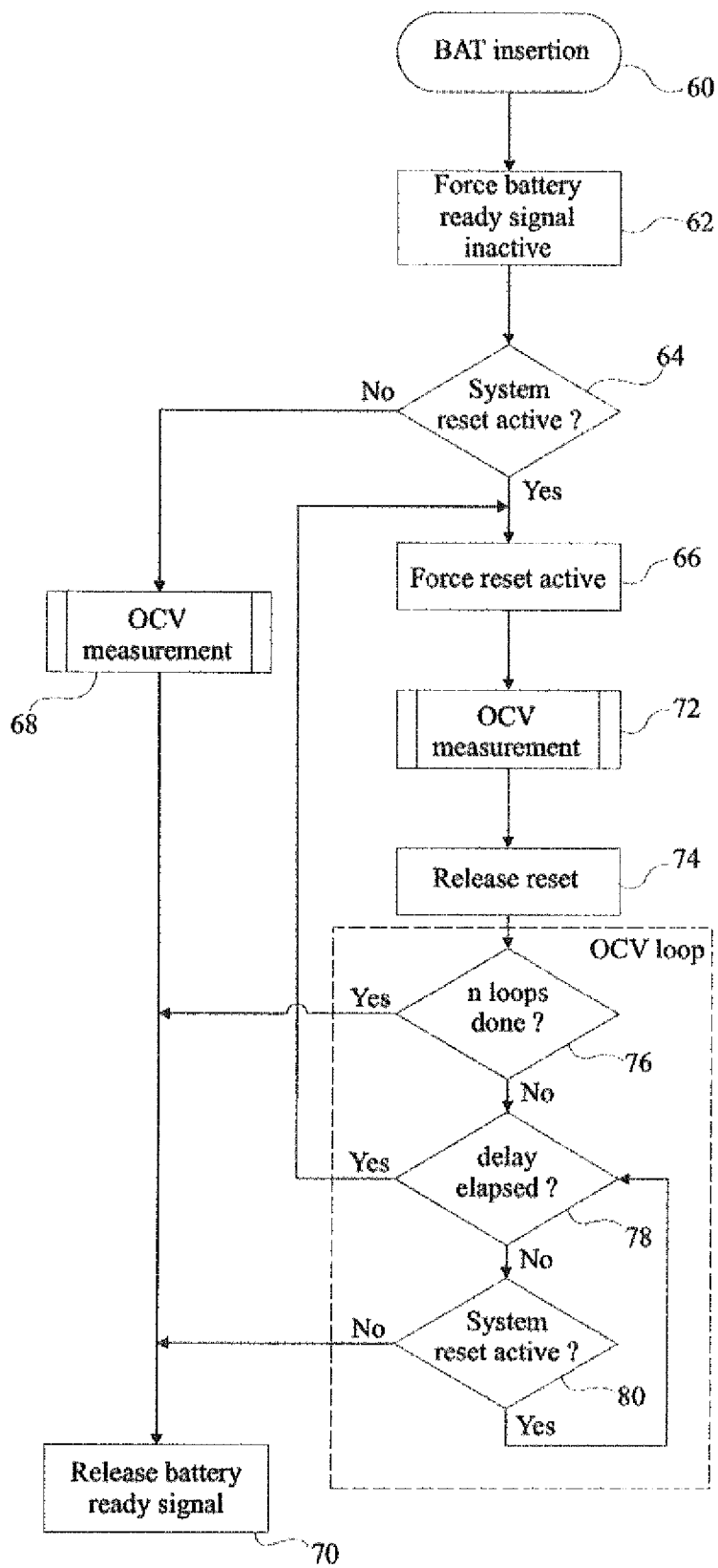
FIG. 6 shows, in the form of a block diagram, an embodiment of a method for measuring the no-load voltage of the battery of the electronic device shown in FIG. 5.

FIG. 6 shows, in the form of a block diagram, an embodiment of a method for measuring the no-load voltage of battery 12 of electronic device 60 and FIG. 7 is an example of a timing diagram of signals of electronic device 60 on implementation of the measurement method illustrated in FIG. 6. Call $t'_0$ to $t'_8$ successive times.

The embodiment of the measurement method illustrated in FIG. 6 enables to perform several successive measurements of the no-load voltage of battery 12. When battery 12 is connected, the no-load voltage of battery 12 may vary. This may happen when battery 12 is connected to electronic device 60 just after having been charged by a battery charger while battery 12 is removed from electronic device 60. By performing several successive measurements of the no-load voltage, processing unit 16 can more accurately determine the charge rate of battery 12 based on the measured no-load voltage values.

At step 60 (BAT insertion), battery 12 is inserted in device 60. Voltage VCC increases to exceed voltage UVLO (time $t'_0$ in FIG. 7). The method carries on at step 62.

At step 62 (Force battery ready signal inactive), control unit 44 sets signal S' to the low level time $t'_1$ in FIG. 7). Transistor 50 is then conductive and substantially equivalent to an on switch. Voltage $V_{THERM}$ thus is at value UP set by the voltage dividing bridge formed of resistors 28 and 52. The charge of battery 12 by charge unit 20 is not possible.

The method carries on at step 64. Control unit 44 further sets signal S to the low level. The level of signal RESET is then set by power supply unit 14.

At step 64 (System reset active?), control unit 44 determines whether signal RESET is at the low level. If signal RESET is at the low level, the method carries on at step 66. If signal RESET is at the high level, this means that processing unit 16 may be starting, and the method carries on at step 68.

At step 68 (OCV measurement), sensor 23 measures voltage VCC as described previously. However, in this case, it is not certain that the measured voltage is the no-load voltage of battery 12. However, the only possible cause of disturbance is that processing unit 16 has started. The method carries on at step 70.

At step 70 (Release battery ready signal), control unit 44 sets signal S' to the high level. Transistor 50 is then non-conductive and is substantially equivalent to an off switch. The charge of battery 12 by charge unit 20 is then possible.

At step 66 (Force reset active), control unit 44 sets signal S to the high level (time $t'_2$ in FIG. 7). Transistor 46 is then conductive and substantially equivalent to an on switch. Signal RESET is then maintained at the low level. The method carries on at step 72.

At step 72 (OCV measurement), sensor 23 measures voltage VCC in known fashion (time $t'_3$ in FIG. 7). It is then certain that the measured voltage is the no-load voltage of battery 12. The method carries on at step 74.

At step 74 (Release reset), the measurement of voltage VCC is finished (time $t'_4$ in FIG. 7). Digital data VOLTAGE is stored in memory 24 and can be read. Control unit 44 sets signal S to the low level. Transistor 42 is then non-conductive and is substantially equivalent to an of switch. The level of signal RESET is then set by power supply unit 14. The method carries on at step 76.

At step 76 (n loops done?), control unit 44 determines whether n measurements have been performed, where n is an integer greater than or equal to 2, preferably greater than or equal to 5, for example, equal to 8. In FIG. 7, as an example, n is equal to 2. If the n measurements have been performed, the method carries on at step 70. If the n measurements have not been performed yet, the method carries on at step 78.

At step 78 (delay elapsed?), control unit 44 determines whether the delay between the beginning of two successive measurements has elapsed. This delay may be of several seconds, for example, longer than 10 seconds, preferably longer than or equal to 15 seconds. In the case where the delay between two measurements has elapsed, the method carries on at steps 66, 72, and 74 at which a new measurement is performed (between times and $t'_6$ and $t'_7$ in FIG. 7). In the case where the delay between the beginning of two successive measurements has not elapsed, the method carries on at step 80.

At step 80 (System reset active?), control unit 44 determines whether signal RESET is at the low level. If signal RESET is at the low level, the method carries on at step 78. If signal RESET is at the high level, which means that processing unit 16 may be starting, the method carries on at step 70. At step 70, as described previously, control unit 44 sets signal S' to the high level (time $t'_8$ in FIG. 7). Transistor 50 is then non-conductive and is substantially equivalent to an off switch. The charge of battery 12 by charge unit 20 is then possible.

Specific embodiments of the present invention have been described. Various alterations, modifications, and improvements will readily occur to those skilled in the art. In particular, each of bipolar transistors 32, 46, and 50 may be replaced with any means capable of behaving as a switch. As an example, each bipolar transistor 32, 46, and 50 may be replaced with a field-effect metal-oxide gate transistor, or MOS transistor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for measuring the voltage of a battery of an electronic device comprising:

using a measurement device integrated to the electronic device, wherein, after connecting the battery to the electronic device, the measurement device prevents battery charge and discharge operations during the measurement, wherein the electronic device includes a processing unit powered in operation by the battery and a power supply unit providing a power supply voltage to the processing unit from the battery voltage, generating from the measurement device to the processing unit a first signal at a first level to allow the starting of the processing unit and at a second level to prevent the starting of the processing unit during measurement;

setting the first signal to the second level during successive measurements when a set delay has elapsed after each measurement and the first signal remains at the second level;

measuring and storing no-load voltage values in a memory of the measurement device;

determining a charge rate of the battery based on the stored no-load voltage values;

wherein the electronic device includes a charge unit connected to a power source, and the method further comprises recharging the battery when the charge unit is connected to the power source; and preventing a battery charge operation by the charge unit during the measurement;

measuring a second signal at a terminal of the battery and not charging the battery when the second signal is greater than a threshold and maintaining the second signal above the threshold during the measurement; and wherein, on connection of the battery to the electronic device, the measurement device prevents battery charge and discharge operations during several successive measurements.

2. An electronic device comprising:

a battery;

a measurement device for measuring the battery voltage, wherein the measurement device, after the connection of the battery to the electronic device, is configured to prevent battery charge and discharge operations during the measurement;

a processing unit connected to the battery and powered therefrom and a memory coupled to the processing unit;

a power supply unit connected to the processing unit and providing power supply voltage to the processing unit from the battery voltage, and configured to generate to the processing unit a first signal at a first level to allow the starting of the processing unit and at a second level to prevent the starting of the processing unit, the measurement device setting the first signal to the second level during successive measurements when a set delay has elapsed after each measurement and the first signal remains at the second level, wherein the measurement device is configured to measure no-load voltage values and store them in the memory, and said processing unit is configured to determine a charge rate of the battery based on the stored no-load voltage values;

wherein the battery comprises a terminal connected to a charge unit, and the charge unit is configured to measure a second signal on the terminal and not charge the battery when the second signal is greater than a threshold, and wherein the measurement device is configured to maintain the second signal above the threshold during the measurement; and wherein on connection of the battery to the electric device, the measurement device is configured to prevent battery charge and discharge operations during several successive measurements.

3. The device of claim 2, comprising the charge unit and a power source and the charge unit configured to recharge the battery when it is connected to the power source.

4. An electronic device comprising:

a measurement device for measuring a battery voltage, wherein the measurement device, after connection of a battery to the electronic device, is configured to prevent battery charge and discharge operations during the measurement;

a processing unit configured to be powered from the battery and a memory coupled to the processing unit;

a power supply unit connected to the processing unit and providing power supply voltage to the processing unit from the battery voltage, and configured to generate to the processing unit a first signal at a first level to allow the starting of the processing unit and at a second level to prevent the starting of the processing unit, the measurement device setting the first signal to the second level during successive measurements when a set delay has elapsed after each measurement and the first signal remains at the second level, wherein the measurement device is configured to measure no-load voltage values and store them in the memory, and said processing unit is configured to determine a charge rate of the battery based on the stored no-load voltage values;

wherein a charge unit is configured to measure a second signal on a terminal of a battery and not charge the battery when the second signal is greater than a threshold, and wherein the measurement device is configured to maintain the second signal above the threshold during the measurement; and wherein on connection of the battery to the electric device, the measurement device is configured to prevent battery charge and discharge operations during several successive measurements.

5. The device of claim 4, comprising the charge unit and a power source and the charge unit configured to recharge the battery when it is connected to the power source.

\* \* \* \* \*